United States Patent
Ngo et al.

(10) Patent No.: US 6,596,631 B1
(45) Date of Patent: Jul. 22, 2003

(54) METHOD OF FORMING COPPER INTERCONNECT CAPPING LAYERS WITH IMPROVED INTERFACE AND ADHESION

(75) Inventors: Minh Van Ngo, Fremont, CA (US); Hartmut Ruelke, Dresden Wilschdorf (DE); Lothar Mergili, Radebeul (DE); Joerg Hohage, Dresden (DE); Lu You, Santa Clara, CA (US); Robert A. Huertas, Hollister, CA (US); Richard J. Huang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 257 days.

(21) Appl. No.: 09/626,455

(22) Filed: Jul. 26, 2000

(51) Int. Cl.$^7$ .................. H01L 2/44; H01L 21/3205; H01L 21/4763

(52) U.S. Cl. .................. 438/653; 438/586; 438/627; 438/643; 438/687; 438/913

(58) Field of Search .................. 438/586, 587, 438/653, 625, 913, 627, 622, 643, 597

(56) References Cited

U.S. PATENT DOCUMENTS

| | | | | |
|---|---|---|---|---|
| 6,153,523 A | * | 11/2000 | Van Ngo et al. | 428/687 |
| 6,174,810 B1 | * | 1/2001 | Islam et al. | 438/687 |
| 6,225,210 B1 | * | 5/2001 | Ngo et al. | 438/624 |
| 6,242,347 B1 | * | 6/2001 | Vasudev et al. | 438/680 |

\* cited by examiner

*Primary Examiner*—Vu A. Le
*Assistant Examiner*—Adam Pyonin

(57) ABSTRACT

The integrity of the interface and adhesion between a barrier or capping layer and a Cu or Cu alloy interconnect member is significantly enhanced by delaying and/or slowly ramping up the introduction of silane to deposit a silicon nitride capping layer after treating the exposed planarized surface of the Cu or Cu alloy with an ammonia-containing plasma. Other embodiments include purging the reaction chamber with nitrogen at elevated temperature to remove residual gases prior to introducing the wafer for plasma treatment.

19 Claims, 2 Drawing Sheets

METHOD OF FORMING COPPER INTERCONNECT CAPPING LAYERS WITH IMPROVED INTERFACE AND ADHESION

RELATED APPLICATIONS

This application contains subject matter related to subject matter disclosed in copending U.S. Pat. No 6,153,523 issued on Nov. 28, 2000.

TECHNICAL FIELD

The present invention relates to copper (Cu) and/or Cu alloy metallization in semiconductor devices, particularly to reliably capping Cu or Cu alloy interconnects. The present invention is applicable to manufacturing high speed integrated circuits having submicron design features, and high conductivity interconnect structures.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance-capacitance) interconnect pattern, particularly wherein submicron vias, contacts and trenches have high aspect ratios imposed by miniaturization.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometry's shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the RC delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.18 micron and below, e.g., about 0.15 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-a-vis W, making Cu a desirable metal for use as a conductive plug as well as conductive wiring.

An approach to forming Cu plugs and wiring comprises the use of darnascene structures employing CMP, as in Teong, U.S. Pat. No. 5,693,563. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology employing a diffusion barrier layer (capping layer). For example, conventional practices comprise forming a damascene opening in an interlayer dielectric, depositing a barrier layer such as TaN, lining the opening and on the surface of the interlayer dielectric, filling the opening with Cu or a Cu alloy layer, CMP, and forming a capping layer on the exposed surface of the Cu or Cu alloy. It was found, however, that capping layers, such as silicon nitride, deposited by plasma enhanced chemical vapor deposition (PECVD), exhibit poor adhesion to the Cu or Cu alloy surface. Consequently, the capping layer is vulnerable to removal, as by peeling due to scratching or stresses resulting from subsequent deposition of layers. As a result, the Cu or Cu alloy is not entirely encapsulated and Cu diffusion occurs, thereby adversely affecting device performance and decreasing the electromigration resistance of the Cu or Cu alloy interconnect member. Moreover, conventional PECVD silicon nitride capping layers have a density of about 2.62 g/cm$^3$ and, hence, are not particularly effective as an etch stop layer during formation of interconnects for subsequent metallization levels.

In copending application Ser. No. 09/112,472 filed on Jul. 9, 1998, the adhesion problem of a PECVD silicon nitride capping layer to a Cu interconnect was addressed by initially treating the exposed surface with a hydrogen-containing plasma, forming a copper silicide layer on the treated surface and depositing a silicon nitride capping layer thereon. In copending U.S. Pat. No. 6,165,894 issued on Dec. 26, 2000, the adhesion problem of a silicon nitride capping layer to a Cu interconnect was addressed by treating the exposed surface with an ammonia-containing plasma and depositing a silicon nitride capping layer thereon. In copending U.S. Pat. No. 6,153,523 issued on Nov. 28, 2000, a method is disclosed wherein the exposed surface is treated with an ammonia-containing plasma and then depositing a silicon nitride capping layer under high density plasma conditions to achieve a density of about 2.67 to about 2.77 $g/cm^3$. In copending application Ser. No. 09/497,850 filed on Feb. 4, 2000, a method is disclosed comprising treating the surface of a Cu or Cu alloy layer with a plasma containing nitrogen and ammonia, followed by depositing the capping layer in the presence of nitrogen in the same reaction chamber for improved adhesion of the capping layer to the copper interconnect. These techniques have been effect.

However, after further experimentation ad investigation, it was found that the surface of the Cu or Cu allow layer after plasma treatment to remove the copper oxide exhibited a discoloration, e.g., a black and/or green discoloration, indicating a poisoning and/or corrosion of the plasma treated Cu or Cu alloy surface prior to depositing the capping layer. This corrosion and/or poisoning problem at the interface between the Cu or Cu alloy interconnect and the capping layer, e.g., silicon nitride capping layer, adversely affects adhesion therebetween.

As design rules extend deeper into the submicron range, such as about 0.18 micron and under, e.g., about 0.15 micron and under, the reliability of the interconnect pattern becomes particularly critical. Therefore, the adhesion of capping or barrier layers to Cu interconnects and the accuracy of interconnects for vertical metallization levels require even greater reliability. Accordingly, there exists a need for methodology enabling the formation of encapsulated Cu and Cu alloy interconnect members for vertical metallization levels with greater accuracy and reliability. There exists a particular need for methodology enabling the formation of a capping layer on a Cu or Cu alloy interconnect with strong adhesion therebetween.

DISCLOSURE OF THE INVENTION

An advantage of the present invention is a method of manufacturing a semiconductor device having highly reliable Cu or Cu alloy interconnect members.

Another advantage of the present invention is a method of manufacturing a semiconductor device comprising a Cu or Cu alloy interconnect member having a silicon nitride capping layer tightly adhered thereto.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising sequentially: treating a surface of a copper (Cu) or Cu alloy with a plasma containing ammonia in a reaction chamber at a first pressure; reducing the first pressure to a second pressure of about 50 m Torr to about 100 m Torr over a period of about 30 seconds to about 60 seconds; introducing silane into the reaction chamber; and depositing a silicon nitride barrier layer on the surface of the Cu or Cu alloy layer in the reaction chamber.

Another aspect of the present invention is a method of manufacturing a semiconductor device, the method comprising sequentially: heating a reaction chamber to a temperature of about 300° C. to about 420° C.; purging the reaction chamber with nitrogen at the temperature of about 300° C. to about 420° C.; introducing a wafer into the chamber, the wafer containing a surface of a copper (Cu) or Cu alloy layer; treating the surface of the Cu or Cu alloy layer with and ammonia-containing plasma; and forming a barrier layer on the treated surface of the Cu or Cu alloy in the reaction chamber.

Embodiments of the present invention include gradually introducing silane into the reaction chamber, as in a plurality of short stages, until reaching a flow rate of at least about 150 sccm before initiating deposition of the silicon nitride barrier layer. Embodiments of the present invention further include initially purging the reaction chamber in a plurality of stages prior to introducing the wafer. Embodiments of the present invention further include forming an opening in an interlayer dielectric on a wafer, depositing an underlying diffusion barrier layer, such as TaN, lining the opening and on the interdielectric layer, depositing the Cu or a Cu alloy layer on the diffusion barrier layer filling the opening and over the interlayer dielectric, removing any portion of the Cu or Cu alloy layer beyond the opening by CMP, leaving an exposed surface oxidized, and conveying the wafer into the reaction chamber for processing in accordance with the present invention by treating the exposed surface of the Cu or Cu alloy layer with an ammonia-containing plasma; and depositing a silicon nitride barrier layer on the treated surface.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
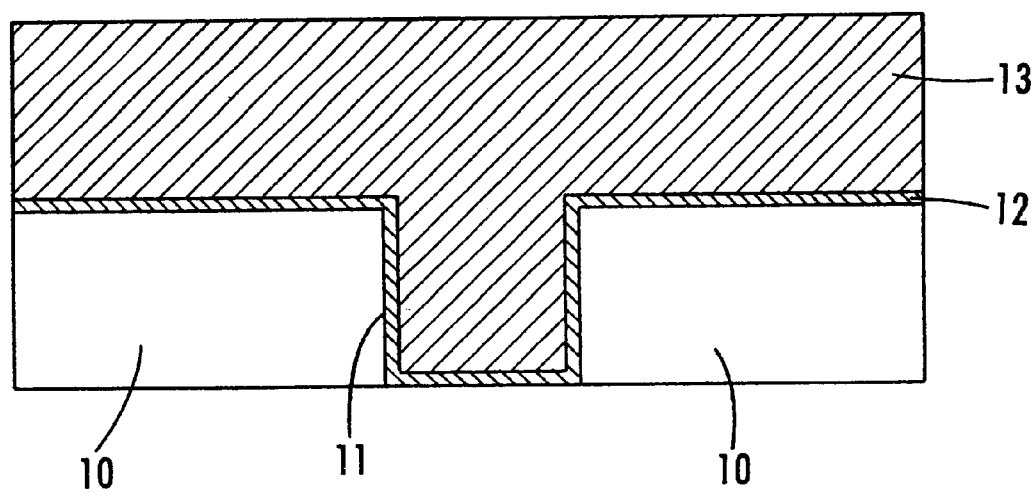
FIGS. 1–4 illustrate sequential phases of a method in accordance with an embodiment of the present invention.

The present invention addresses and solves problems attendant upon capping a Cu or Cu alloy interconnect, as with a capping layer of silicon nitride. Methodology in accordance with embodiments of the present invention enables a significant improvement in the adhesion of a capping layer such as silicon nitride, to a Cu or Cu alloy interconnect member, thereby preventing capping layer peeling, preventing copper diffusion and enhancing electromigration resistance. As employed throughout this application, the symbol Cu is intended to encompass high purity elemental copper as well as Cu-based alloys, such as Cu alloys containing minor amounts of tin, zinc, maganese, titanium, magnesium and gerianium.

As design rules are scaled down into the deep submicron range, such as about 0.18 micron and under, e.g., about 0.15 micron and under the reliability of encapsulated Cu and/or Cu alloy interconnect members becomes increasingly significant. It was found that conventional practices in forming a Cu and/or Cu alloy interconnect member is a damascene opening result in the formation of a thin copper oxide surface film, believed to comprise a mixture of CuO and $Cu_2O$ formed during CMP. The thin copper oxide surface film layer is porous and brittle in nature. The presence of such a thin copper oxide surface film undesirably reduces the adhesion of a capping layer, such as silicon nitride, to the underlying Cu and/or Cu alloy interconnect member. Consequently, cracks are generated at the Cu or Cu alloy/copper oxide interface, resulting in copper diffusion ad increased electromigration as a result of such diffusion. The cracks occurring in the Cu or Cu alloy/copper oxide interface enhance surface diffusion, which is more rapid than grain boundary diffusion or lattice diffusion. The hydrogen plasma treatment disclosed in copending application Ser. No, 09/112,472 and the ammonia plasma treatment disclosed in copending U.S. Pat. No 6,165,894 improve adhesion of a silicon nitride capping layer to the Cu or Cu alloy layer. The present invention constitutes an improvement over the methodology disclosed in such copending applications by further significantly improving adhesion of the capping layer, such as silicon nitride.

Upon conducting experimentation and investigation, it was found that the surface of the Cu metallization, after plasma treatment to reduce the copper oxide, exhibited discoloration, e.g., black and/or green discoloration. It is believed that such discoloration is indicative of corrosion and/or poisoning which degrades the interface between the Cu and capping layer, as by reducing the adhesion therebetween. Further experimentation and investigation led to the belief that such degradation or poisoning of the interface between the Cu and capping layer stems from various factors.

During experimentation and investigation it was observed that subsequent to plasma treating the Cu surface to remove copper oxide, the reaction chamber was pumped down for a period of about 10 seconds and the reaction gas for depositing the capping layer introduced into the reaction chamber at a flow rate suitable for deposition. For example, it was found that when depositing a silicon nitride capping layer on a Cu surface after treatment with a ammonia-containing plasma, silane is introduced into the reaction chamber via a mass flow controller set at about 150 sccm. However, an initial surge or spike is frequently encountered, whereby the silane actually enters the reaction chamber at a higher flow rate, e.g., about 200 to about 300 sccm. It is believed that the Cu surface immediately after plasma treatment to reduce copper oxide is extremely sensitive and, hence, susceptible to degradation. It is further believed that the initial surge of silane into the reaction chamber shortly after plasma treatment adversely impacts the sensitive Cu surface leading to corrosion and/or poisoning of the interface between the Cu interconnect and the silicon nitride capping layer. Additional experimentation and investigation led to the further belief that residual gasses in the reaction chamber between wafer processing operations contribute to discoloration and/or poisoning of the Cu surface after plasma treatment.

The present invention addresses and solves the problem of corrosion and/or poisoning of the Cu surface after treatment with a hydrogen- or ammonia-containing plasma, thereby significantly improving the integrity of the interface between the Cu interconnect and capping layer, e.g., silicon nitride capping layer. Accordingly, the present invention enables a significant increase in device reliability, particularly in the submicron regime.

In accordance with embodiments of the present invention, the period of time between plasma treatment and capping layer deposition is extended vis-a-vis conventional practices for the purpose of providing sufficient time for the plasma-treated Cu surface to desensitize to reduce its susceptibility to degradation before introducing the reaction gas for depositing the capping layer, e.g., silane when depositing a silicon nitride capping layer. Accordingly, embodiments of the present invention comprise slowly reducing the pressure after plasma treating the Cu surface. For example, plasma-treatment of the Cu surface can be conducted at a first pressure of about 5 Torr. to about 8 Torr. After plasma treatment, the pressure can be reduced to a pressure of about 50 m Torr. to about 100 m Torr. over an extended period of about 30 seconds to about 60 seconds to provide sufficient time for desensitization of the plasma treated Cu surface.

Further embodiments of the present invention comprise introducing the capping layer reaction gas, e.g., silane, slowly and gradually increasing the reaction gas flow until the amount required for deposition is achieved. For example, embodiments of the present invention comprise slowly introducing silane until reaching a flow rate of about 150 sccm. A suitable ramp up comprises introducing silane in a plurality of stages, during each of which the flow rate is increased by an amount of 30 sccm over a 5 second interval.

In accordance with another embodiment of the present invention, residual gasses in the reaction chamber are removed prior to introducing the wafer for processing. Accordingly, embodiments of the present invention comprise purging the reaction chamber, as by introducing nitrogen gas, while maintaining the reaction chamber at a temperature suitable for processing, e.g., at about 320° C. to about 420° C. The nitrogen gas can be introduced at a relatively low pressure, e.g., less than up to about 1 Torr. It was found particularly suitable to introduce nitrogen gas in a plurality of stages to effect proper conditioning of the chamber before introducing the wafer. For example, it was found suitable to introduce nitrogen gas in three stages for purging, each stage comprising introducing nitrogen gas, discontinuing introducing nitrogen gas and then pumping the nitrogen gas out of the reaction chamber.

The nitrogen gas pre-conditioning aspect of the present invention coupled with slowly ramping up the introduction of the silane gas provide optimum results, although any of the disclosed remedial approaches contributes significantly toward improving the integrity of the interface between the Cu surface and silicon nitride capping layer. Thus, the present invention ensures greater reliability by conditioning the reaction chamber prior to introducing the wafer in order to reduce discoloration and/or poisoning of the surface of the Cu interconnect after plasma treatment. The present invention also achieves that objective by providing time after plasma treatment of the Cu surface before introduction of the silane for reducing the sensitivity of the Cu surface thereby avoiding discoloration and/or poisoning of the interface. The present invention also involves slowly ramping up the introduction of silane after plasma treatment to an appropriate flow rate before initiating deposition, thereby further reduces discoloration and/or poisoning of the interface between Cu interconnect and silicon nitride capping layer.

Cu and/or Cu alloy interconnect members formed in accordance with embodiments of the present invention can be, but are not limited to, interconnects formed by damascene technology. Thus, embodiments of the present invention include forming an interlayer dielectric overlying a substrate, forming an opening, e.g., a damascene opening, in the interlayer dielectric, depositing a diffusion barrier layer, such as TaN, and filling the opening with Cu or a Cu alloy layer. Advantageously, the opening in the interlayer dielectric can be filled by initially depositing a seed layer and then electroplating or electrolessly plating the Cu or Cu alloy layer. CMP is then performed such that the upper surface of the Cu or Cu alloy layer is substantially coplanar with the upper surface of the interlayer dielectric. As a result of CMP, a thin film of copper oxide is typically formed. The exposed oxidized surface of the Cu or Cu alloy is then processed in accordance with one or more disclosed embodiments, thereby substantially eliminating or significantly reducing corrosion and/or poisoning of the Cu/silicon nitride interface.

Given the guidance of the present disclosure and the disclosed objectives, the conditions during ammonia plasma treatment and deposition of the capping layer, such as silicon nitride, can be optimized in a particular situation. For example, it was found suitable to treat the exposed surface of the Cu or Cu alloy layer with an ammonia-containing plasma at an ammonia flow rate of about 100 to about 6,000 sccm, a pressure of about 2 Torr. to about 10 Torr., a temperature of about 300° C. to about 420° C., a high frequency power of about 100 to about 1,000 watts, and a low frequency of about 50 to about 500 watts for a suitable period of time, such as up to about 60 seconds. It was also found suitable to deposit a silicon nitride capping layer by plasma enhanced chemical vapor deposition at a silane flow rate of about at least about 150 sccm, an ammonia flow rate of about 100 to about 6,000 sccm, a nitrogen flow rate of about 6,000 to about 10,000 sccm, a pressure of about 1.2 Torr to about 6.0 Torr a temperature of about 300° C. to about 420° C., a high frequency power of about 100 to about 1,000 watts, and a low frequency power of about 50 to about 500 watts, for a suitable period of time, e.g., about 10 second to about 100 seconds. Advantageously, the entire procedure involving treatment of the Cu metallization with an ammonia-containing plasma and plasma deposition of the silicon nitride capping layer is conducted in the same reaction chamber.

In accordance with embodiments of the present invention, the damascene opening can also be filled with Cu or a Cu alloy by PVD at a temperature of about 50° C. to about 150° C. or by CVD at a temperature under about 200° C. In various embodiments of the present invention, conventional substrates and interdielectric layers, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron- and phosphorus doped silicate glass (BPSG), and silicon dioxide derived from tetraethylorthosilicate (TEOS) or silane by PECVD can be employed. The openings formed in dielectric layers are effected by conventional photolithographic and etching techniques. Interlayer dielectrics in accordance with the present invention can also comprise low dielectric contact materials, including polymers, such as polyamides.

An embodiment of the present invention is schematically illustrated in FIGS. 1–4, wherein similar reference numerals denote similar features. Adverting to FIG. 1, damascene opening 11, such as a contact or via hole, is formed in dielectric layer 10, e.g., silicon dioxide. It should be understood that opening 11 can also be formed as a dual damascene opening comprising a contact or via hole section in communication with a trench section. A barrier layer 12 is deposited, such as TaN, Cu or a Cu alloy layer 13 is then deposited. Upon electroplating or electroless plating layer 13, a seed layer (not shown) is deposited on barrier layer 12.

Figure 2:
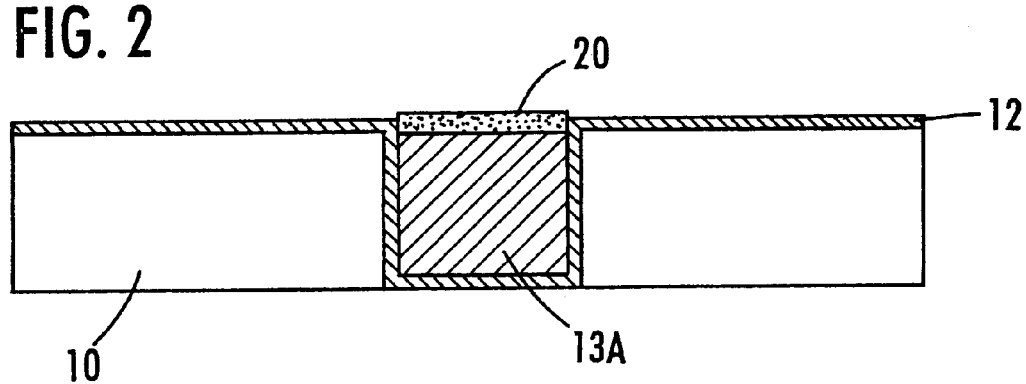

Adverting to FIG. 2, the portions of the Cu or Cu alloy layer 13 extending beyond opening 11 are removed, as by CMP. As a result, a tin film of copper oxide 20 is formed on the exposed surface of the Cu or Cu alloy interconnect member 13A. The wafer containing the Cu metallization is then introduced into a reaction chamber in accordance with the embodiments of the present invention. The reaction chamber is initially purged with nitrogen at a temperature of about 300° C. to about 420° C. to remove residual gasses from previous processing and condition the reaction chamber for plasma treatment and capping layer deposition. It was found particularly suitable to purged the reaction chamber in a plurality of stages each time introducing nitrogen, discontinuing the introduction of nitrogen, and pumping out the nitrogen, for optimum conditioning.

Figure 3:
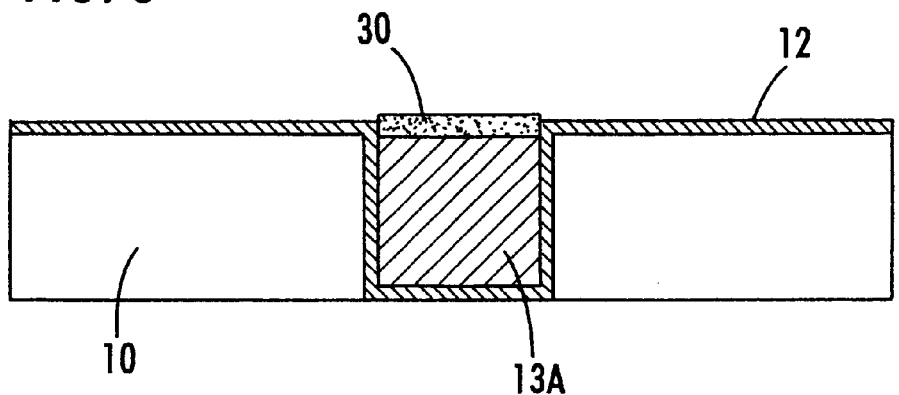

Adverting to FIG. 3, in accordance with embodiments of the present invention, the exposed surface of the Cu or Cu alloy interconnect member 13A having a thin copper oxide film 20 thereon is treated with an ammonia-containing plasma to remove or substantially reduce the thin copper oxide film 20 leaving a clean reduced Cu or Cu alloy surface 30. At this point the pressure is lowered over a period of time, e.g., about 30 seconds to about 60 seconds, to afford sufficient time for the plasma treated Cu surface to desensitize so that it is less vulnerable to degradation upon introduction of silane. Silane is then introduced slowly and ramped up, as in a plurality of stages, until a flow rate of at least about 150 sccm is achieved. At this point, deposition of the silicon nitride capping layer is initiated.

Figure 4:
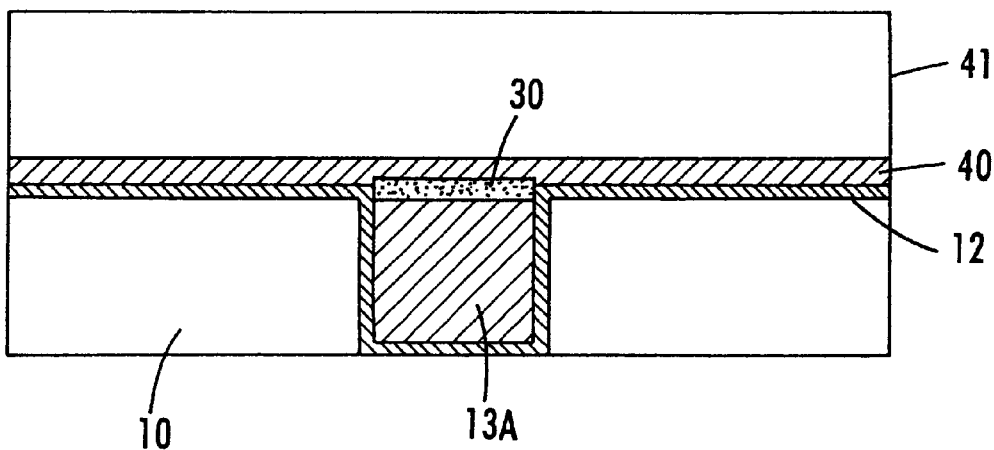

As shown in FIG. 4, a silicon nitride capping layer 40 is then deposited on the cleaned exposed surface 30 of Cu or Cu alloy interconnect 13, completely encapsulating the Cu or Cu alloy interconnect 13. Another interlayer dielectric 41 is then deposited, such as silicon dioxide derived from TEOS or silane. In this way, a plurality of interlayer dielectrics and metallization patterns are built up on a semiconductor substrate and various interconnects are formed. Advantageously, the interface between the Cu interconnect and silicon nitride capping layer is substantially free of discoloration and/or poisoning which would otherwise adversely effect the adhesion therebetween, thereby improving the accuracy and reliability of interconnects for subsequent metallization levels.

The present invention enables the formation of extremely reliable Cu and/or Cu alloy interconnect members by significantly reducing the corrosion and/or poisoning of the interface between plasma treated copper surface and silicon nitride capping layer deposited thereon, thereby enhancing the adhesion of the capping layer. Preconditioning the reaction chamber with nitrogen purges and/or providing sufficient time after plasma treatment to render the plasma treated Cu surface less vulnerable to degradation upon introducing silane and/or slowly ramping up the introduction of silane to an appropriate flow rate for deposition address what is believed to be the sources of the corrosion and/or poisoning problem of the interface between the Cu interconnect and capping layer. Thus, the present invention significantly improves the reliability of the Cu and/or Cu alloy interconnect member by enhancing adhesion of the high density plasma capping layer with an attendant reduction in copper diffusion and increase in electromigration resistance. Consequently, the present invention advantageously reduces capping layer peeling, reduces copper diffusion, enhances electromigration resistance, improves device reliability, increases production throughput and reduces manufacturing costs.

The present invention enjoys industrial applicability in the formation of various types of inlaid Cu and Cu alloy metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A method of manufacturing a semiconductor device, the method comprising sequentially:
    treating a surface of a copper (Cu) or Cu alloy with a plasma containing ammonia in a reaction chamber at a first pressure;
    reducing the first pressure to a second pressure of about 50 m Torr to about 100 m Torr over a period of about 30 seconds to about 60 seconds;
    introducing silane into the reaction chamber; and
    depositing a silicon nitride barrier layer on the surface of the Cu or Cu alloy layer in the reaction chamber.

2. The method according to claim 1, comprising treating the surface of the Cu or Cu alloy layer at a first pressure of about 5 Torr to about 8 Torr.

3. The method according to claim 1, comprising depositing the silicon nitride capping layer at a silane flow rate of at least about 150 sccm.

4. The method according to claim 3, comprising gradually introducing the silane into the reaction chamber until reaching the flow rate of at least about 150 sccm before initiating deposition of the silicon nitride capping layer.

5. The method according to claim 4, comprising introducing the silane into the reaction chamber in a plurality of stages until reaching the flow rate of at least about 150 sccm.

6. The method according to claim 5, wherein each of the stages is conducted for a period up to about 5 seconds.

7. The method according to claim 4, comprising treating the surface of the Cu or Cu alloy layer with a plasma at:
    an ammonia flow rate of about 100 to about 5,000 sccm;
    a high frequency power of about 100 to about 1,000 watts;
    a low frequency power of about 50 to about 500 watts;
    a temperature of about 300° C. to about 420° C.; and
    a pressure of about 1.2 Torr to about 8 Torr.

8. The method according to claim 7, comprising depositing the silicon nitride barrier layer at:
    a silane flow rate of at least about 150 sccm;
    an ammonia flow rate of about 100 to about 6,000 sccm;
    a nitrogen flow rate of about 6,000 to about 10,000 sccm;
    a high frequency power of about 100 to about 1,000 watts;
    a low frequency power of about 50 to about 500 watts;
    a temperature of about 300° C. to about 420° C.; and
    a pressure of about 1.2 Torr to about 6.0 Torr.

9. A method of manufacturing a semiconductor device, the method comprising sequentially:
    heating a reaction chamber to a temperature of about 300° C. to about 420° C.;
    purging the reaction chamber with nitrogen at the temperature of about 300° C. to about 420° C.;
    introducing a wafer into the chamber, the wafer containing an exposed surface of a copper (Cu) or Cu alloy;
    treating the surface of the Cu or Cu alloy layer with an ammonia-containing plasma; and
    forming a barrier layer on the treated surface of the Cu or Cu alloy layer in the reaction chamber.

10. The method according to claim 9, comprising purging the reaction chamber with nitrogen at a pressure no greater than about 1 Torr.

11. The method according to claim 10, comprising purging the reaction chamber with nitrogen in a plurality of stages, each stage comprising: introducing nitrogen into the reaction chamber;
    ceasing introducing nitrogen into the nitrogen into the reaction chamber; and
    pumping nitrogen out of the reaction chamber.

12. The method according to claim 11, comprising treating the surface of the Cu or Cu alloy layer with the ammonia-containing plasma at a first pressure;
    reducing the first pressure to a second pressure of about 50 m Torr to about 100 m Torr over a period of about 30 seconds to about 60 seconds;
    introducing silane into the reaction chamber; and
    depositing a silicon nitride barrier layer on the surface of the Cu or Cu alloy layer in the reaction chamber.

13. The method according to claim 12, comprising treating the surface of the Cu or Cu alloy layer at a first pressure of about 5 Torr to about 8 Torr.

14. The method according to claim 13, comprising depositing the silicon nitride barrier layer at a silane low rate of at least about 150 sccm.

15. The method according to claim 14, comprising gradually introducing the silane into the reaction chamber until reaching the flow rate of at least about 150 sccm before initiating depositing of the silicon nitride barrier layer.

16. The method according to claim 15, comprising introducing the silane into the reaction chamber in a plurality of stages until reaching the flow rate of at least about 150 sccm.

17. The method according to claim 16, wherein each of the stages is conducted for a period up to about 5 seconds.

18. The method according to claim 16, comprising treating the surface of the Cu or Cu alloy layer with a plasma at:
    an ammonia flow rate of about 100 to about 6,000 sccm;
    a high frequency power of about 100 to about 1,000 watts;
    a low frequency power of about 50 to about 500 watts;
    a temperature of about 300° C. to about 420° C.; and
    a pressure of about 1.2 Torr to about 8 Torr.

19. The method according to claim 18, comprising depositing the silicon nitride barrier layer under a high density plasma conditions at:
    a silane flow rate of at least about 150 sccm;
    an ammonia flow rate of about 100 to about 6,000 sccm;
    a nitrogen flow rate of about 6,000 to about 10,000 sccm;
    a high frequency power of about 100 to about 1,000 watts;
    a low frequency power of about 50 to about 500 watts;
    a temperature of about 300° C. to about 420° C.; and
    a pressure of about 1.2 Torr to about 6.0 Torr.

* * * * *